(12) United States Patent
Wu et al.

(10) Patent No.: US 7,619,277 B2
(45) Date of Patent: Nov. 17, 2009

(54) FLASH MEMORY WITH A TRENCH COMMON SOURCE LINE

(75) Inventors: Chun-Pei Wu, Hsinchu (TW);
Huei-Huang Chen, Hsinchu (TW);
Wen-Bin Tsai, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 11/154,381

(22) Filed: Jun. 15, 2005

(65) Prior Publication Data

US 2006/0286746 A1 Dec. 21, 2006

(51) Int. Cl.
*H01L 29/788* (2006.01)
(52) U.S. Cl. ............................... 257/321; 257/E29.304
(58) Field of Classification Search .................. 257/321, 257/E29.304
See application file for complete search history.

(56) References Cited

U.S. PATENT DOCUMENTS 6,525,959 B1 * 2/2003 Fastow .................. 365/185.01
6,621,119 B1 * 9/2003 Wu ............................. 257/321
7,217,964 B1 * 5/2007 Fastow et al. ............... 257/208

* cited by examiner

*Primary Examiner*—Anh Phung
*Assistant Examiner*—Michael Lulis
(74) *Attorney, Agent, or Firm*—J.C. Patents

(57) ABSTRACT

A flash memory includes substrate, control gates, trenches, source regions, isolation structures, drain regions, a common source line, floating gates, tunneling dielectric layers, and dielectric layer. The control gates and the trenches are in first and second directions on the substrate, respectively. The source regions are in the substrate and trenches on one side of control gates. The isolation structures fill the trenches between the source regions. The drain regions are in the substrate on the other side of control gates between the isolation structures. The common source line is in the second direction inside the substrate and electrically connected to the source regions. Furthermore, the floating gates are between the control gates and the substrate that between the source and drain regions. The tunneling dielectric layers are disposed between the floating gates and the substrate, and the dielectric layer is disposed between the floating and control gates.

2 Claims, 7 Drawing Sheets

FLASH MEMORY WITH A TRENCH COMMON SOURCE LINE

BACKGROUND OF THE INVENTION

1. Field of the Invention

The present invention relates to a flash memory. More particularly, the present invention relates to a flash memory that has a smaller distance of separation between memory cells.

2. Description of the Related Art

FIG. 1 is a top view of a conventional flash memory, and FIG. 2 is a schematic cross-sectional view along line II-II' of FIG. 1. As shown in FIGS. 1 and 2, diffusion regions 102 and isolation regions 104 are alternately laid down in the y direction on a substrate 100. Furthermore, a plurality of control gates 106 are aligned in the x direction on the substrate 100. The floating gate (not shown) and the tunneling dielectric layer (not shown) of each memory cell are formed in an overlapping area 110 of each diffusion region 102 and the control gate 106. The diffusion region 102 on one side of the control gate 106 serves as a source region 108a while the diffusion region 102 on the other side serves as a drain region 108b. In general, the drain regions 108b in the same row are electrically connected to a conductive line (not shown) through a plurality of contacts 112. In contrast, the source regions 108a in the same row as shown in FIG. 2 are electrically connected to a line (not shown) through a source pick-up line 116 and contacts 118 set up between the two isolation regions 104, for example, by removing the isolation structures (that is, the isolation regions 104) within the source regions 108a and forming a doped region 114 that connects all the source regions 108a in the same row inside the exposed substrate.

However, a considerable number of contacts are formed in the aforementioned structure, making it quite difficult to reduce the area occupied by a flash memory. In other words, the aforementioned structure is quite out of line with the trend toward miniaturizing semiconductor devices.

SUMMARY OF THE INVENTION

Accordingly, at least one objective of the present invention is to provide a flash memory occupying a smaller surface area.

At least a second objective of the present invention is to provide a method of fabricating flash memory that can reduce the area occupied by the memory device.

At least a third objective of the present invention is to provide a method of fabricating flash memory that can reduce the area occupied by the memory device and simplify the fabrication process as well.

At least a fourth objective of the present invention is to provide a method of fabricating flash memory that can reduce the area occupied by the memory device and improve the accuracy of the processing steps.

To achieve these and other advantages and in accordance with the purpose of the invention, as embodied and broadly described herein, the invention provides a flash memory. The flash memory comprises a substrate, a plurality of control gate lines, a plurality of trenches, a plurality of source regions, a plurality of isolation structures, a plurality of drain regions, a common source line, a plurality of floating gates, a plurality of tunneling dielectric layers, and a dielectric layer. The control gates are aligned in a first direction on the substrate, and the trenches are aligned in a second direction on the substrate surface. The source regions are disposed in the substrate and the trenches on one side of each control gate. The isolation structures fill the respective trenches between the source regions. Furthermore, the drain regions are disposed in the substrate on the other side of the respective control gate between the isolation structures. The common source line is aligned in the second direction inside the substrate and electrically connected to the source regions. The floating gates are disposed between the control gates and the substrate within the areas between the respective source regions and the drain regions. The tunneling dielectric layers are disposed between the floating gates and the substrate, and the dielectric layer is disposed between the floating gates and the control gates.

According to the flash memory in one embodiment of the present invention, the common source line is disposed in the substrate at the bottom of one of the trenches.

According to the flash memory in one embodiment of the present invention, the common source line is disposed in the substrate between two adjacent trenches, and further comprises a conductive layer disposed thereon.

According to the flash memory in one embodiment of the present invention, the memory further comprises a plurality of conductive lines electrically connected to the respective drain regions.

The present invention also provides a method of fabricating a flash memory comprising the following steps. First, a substrate having a plurality of source regions and drain regions aligned in a first direction disposed thereon is provided. Then, a plurality of trenches aligned in a second direction is formed on the surface of the substrate. The trenches have at least a common source region. Thereafter, a first doped region is formed in the substrate at the bottom of the common source region. After that, insulating material is deposited into the trenches to form a plurality of isolation structures that define a plurality of active regions. Thereafter, a tunneling dielectric layer and a floating gate are sequentially formed on the substrate between the respective source regions and drain regions inside the active regions and then a dielectric layer is formed over the substrate to cover the floating gate. A plurality of control gates are formed between the respective source regions and drain regions. Then, the isolation structures in the source regions are removed. After that, a second doped region is formed in the exposed substrate such that the second doped region within the respective source regions is electrically connected to the first doped region.

According to the method of fabricating flash memory in one embodiment of the present invention, the step for forming the first doped region further includes forming a patterned mask over the substrate to expose the substrate at the bottom of the common source region. Then, an ion implantation process is performed on the substrate. After the first doped region is formed, the patterned mask is removed.

According to the method of fabricating flash memory in one embodiment of the present invention, a plurality of conductive lines that electrically connect various drain regions are also formed on the substrate after the second doped region is formed.

The present invention also provides an alternative method of fabricating flash memory comprising the following steps. First, a substrate having a plurality of source regions and drain regions aligned in a first direction thereon is provided. Then, a plurality of trenches aligned in a second direction are formed on the surface of the substrate. The trenches have at least a common source region. After that, insulating material is deposited into the trenches to form a plurality of isolation structures that define a plurality of active regions. Thereafter, a tunneling dielectric layer and a floating gate are sequentially formed on the substrate between the respective source regions and drain regions inside the active regions, and the substrate in the common source region is exposed. Then, a first doped region is formed on the substrate exposed by the common source region. After that, a dielectric layer is formed over the substrate to cover the floating gate. A plurality of control gates is formed between the respective source regions and drain regions; then the isolation structures in the source regions are removed. After that, a plurality of second doped regions are formed on the exposed substrate within the source regions and the drain regions such that the second doped regions within the respective source regions are electrically connected to the first doped region.

According to the method of fabricating flash memory in one embodiment of the present invention, the step of forming the first doped region includes implanting ions into the substrate using the floating gates as a mask in the ion implantation process.

According to the method of fabricating flash memory in one embodiment of the present invention, a plurality of conductive lines are also formed on the substrate to electrically connect various drain regions after the second doped regions are formed.

The present invention also provides yet another method of fabricating flash memory comprising the following steps. First, a substrate having a plurality of source regions and drain regions aligned in a first direction thereon is provided. Then, a plurality of trenches aligned in a second direction are formed on the surface of the substrate. The trenches have at least a common source region. After that, insulating material is deposited into the trenches to form a plurality of isolation structures that define a plurality of active regions; then a first doped region is formed in the substrate in the common source regions. Thereafter, a tunneling dielectric layer and a floating gate are sequentially formed on the substrate between each source region and drain region inside the active regions. After that, a dielectric layer is formed over the substrate to cover the floating gate. A plurality of control gates are formed between the respective source regions and drain regions and then the isolation structures in the source regions are removed. A plurality of second doped regions are formed in the exposed substrate within the source regions and the drain regions such that the second doped regions within the respective source regions are electrically connected to the first doped region.

According to the method of fabricating flash memory in one embodiment of the present invention, the step of forming the first doped region includes forming a patterned mask layer to expose the substrate at the bottom of the common source region. Then, ions are implanted into the substrate in an ion implanting process. After the first doped region is formed, the patterned mask is removed.

According to the method of fabricating flash memory in one embodiment of the present invention, a plurality of conductive lines are also formed on the substrate to electrically connect various drain regions after the second doped regions are formed.

In the present invention, the doped region replaces the contact structures of connecting each memory source region that are found in a conventional design. Hence, the area occupied by the memory is reduced. Furthermore, by modifying the processing step for manufacturing the flash memory, the fabrication process is simplified and the accuracy of the processing operation is improved, in addition to reducing the area occupied by the memory.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
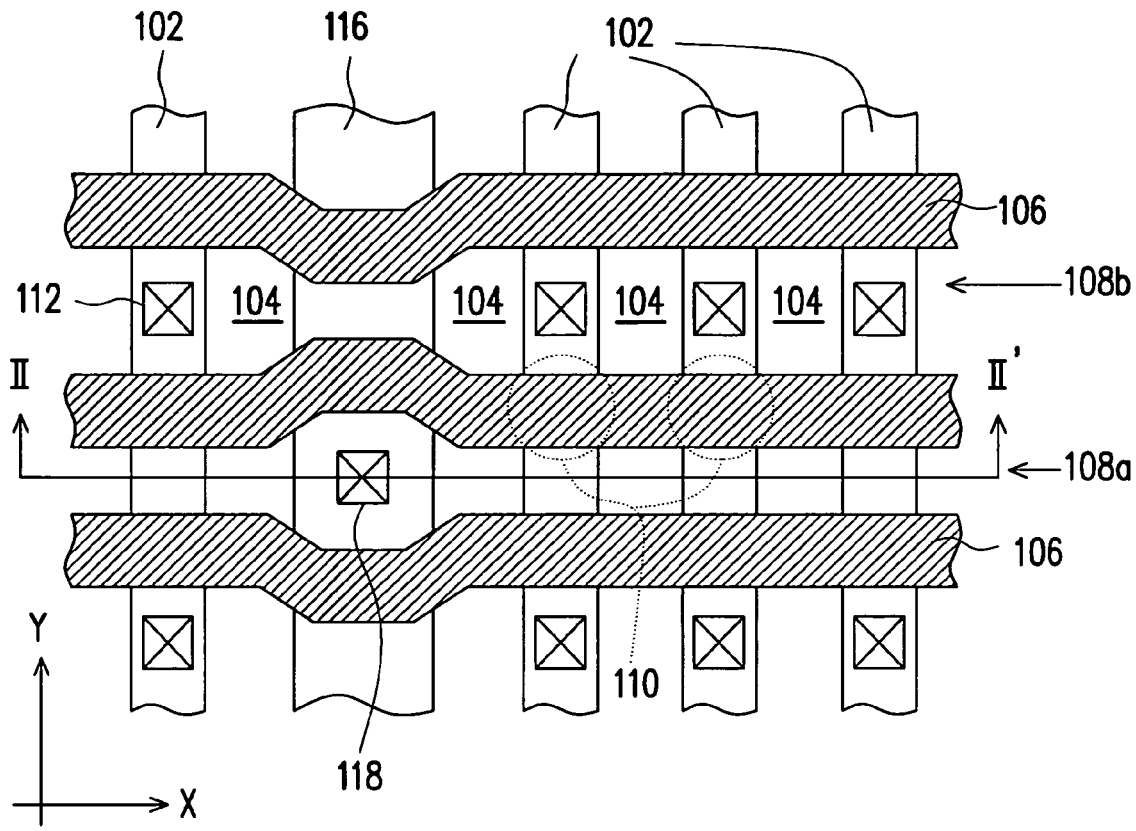
FIG. 1 is a top view of a conventional flash memory.
Figure 2:
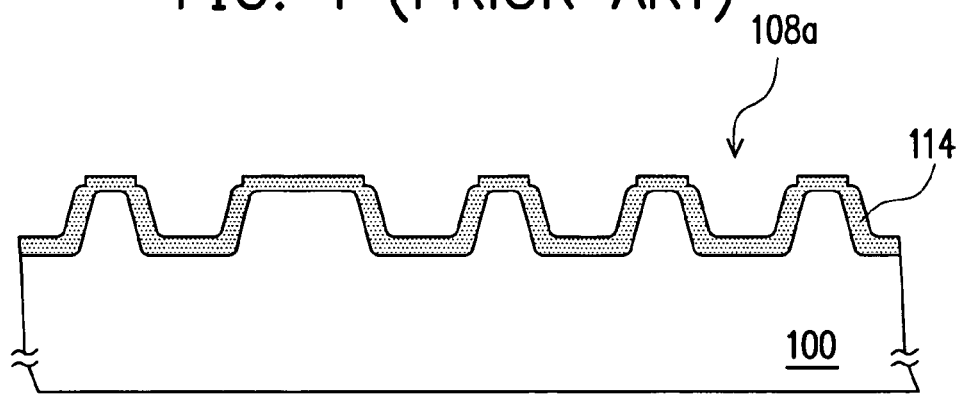
FIG. 2 is a schematic cross-sectional view along line II-II' of FIG. 1.

Reference is now made in detail to the present embodiments of the invention, examples of which are illustrated in the accompanying drawings. Wherever possible, the same reference numbers are used in the drawings and the description to refer to the same or like parts.

Figure 3A:
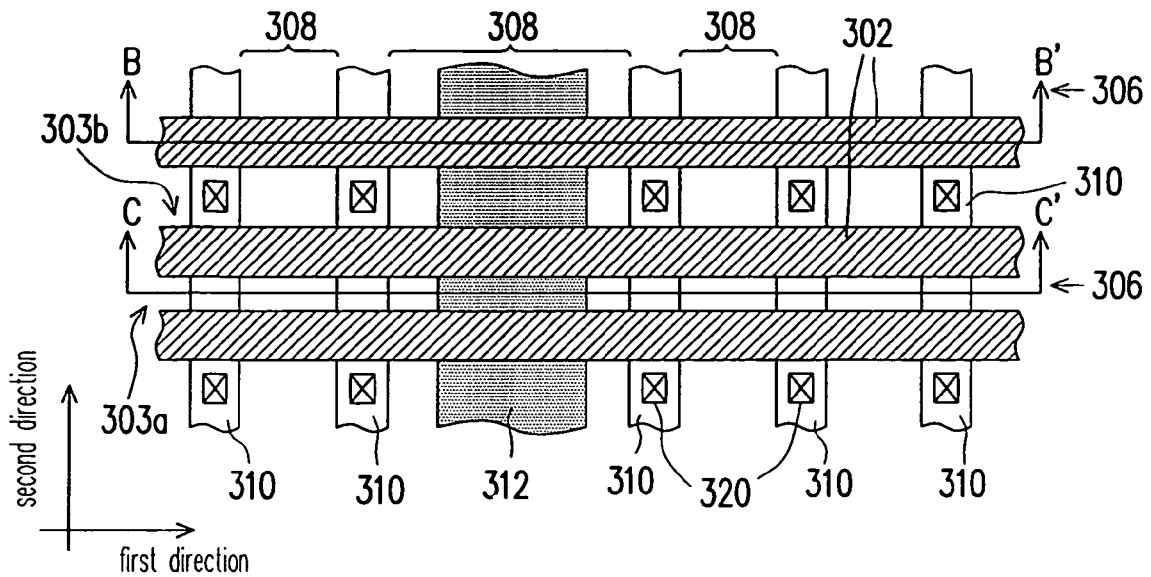
FIG. 3A is a top view of a flash memory according to a first embodiment of the present invention.
Figure 3B:
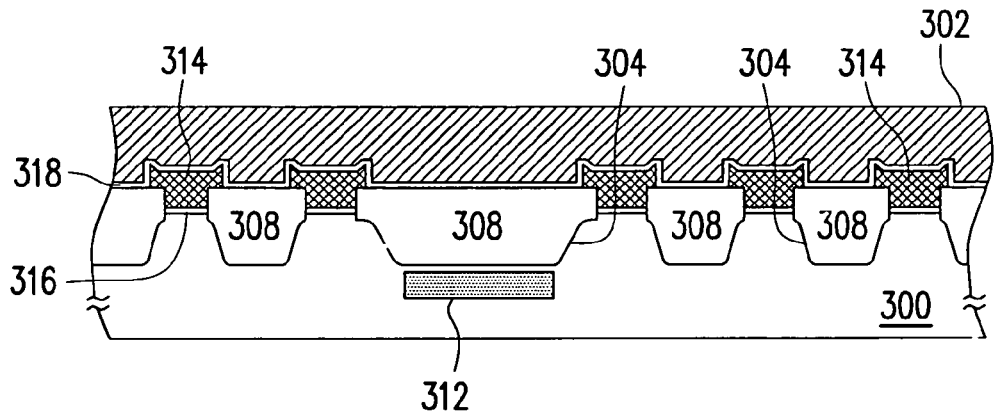
FIG. 3B is a schematic cross-sectional view along line B-B' of FIG. 3A.
Figure 3C:
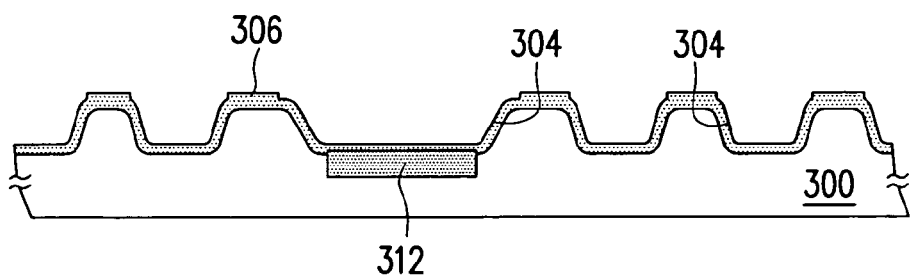
FIG. 3C is a schematic cross-sectional view along line C-C' of FIG. 3A.

FIG. 3A is a top view of a flash memory according to a first embodiment of the present invention. FIG. 3B is a schematic cross-sectional view along line B-B' of FIG. 3A. FIG. 3C is a schematic cross-sectional view along line C-C' of FIG. 3A.

As shown in FIGS. 3A through 3C, the flash memory according to the present embodiment comprises a substrate 300, a plurality of control gates 302, a plurality of trenches 304, a plurality of source regions 306, a plurality of isolation structures 308, a plurality of drain regions 310, a common source line 312, a plurality of floating gates 314, a plurality of tunneling dielectric layers 316 and a dielectric layer 318. The control gates 302 are aligned in a first direction on the substrate 300 and the trenches 304 are aligned in a second direction on the surface of the substrate 300. The source regions 306 are disposed in the substrate 300 and the trenches 304 on one side 303a of the respective control gates 302. The isolation structures 308 completely fill the respective trench 304 between the drain regions 310. Furthermore, the drain regions 310 are disposed in the substrate 300 between the isolation structures 308 on the other side 303b of the respective control gates 306. The common source line 312 is aligned in the second direction within the substrate 300 and electrically connected to the source regions 306. Furthermore, each floating gate 314 is disposed between the control gates 302 and the substrate 300 that between the respective source regions and drain regions. The tunneling dielectric layers 316 are disposed between the floating gates 314 and the substrate 300, and the dielectric layer 318 is disposed between the floating gates 314 and the control gates 302.

According to the first embodiment shown in FIG. 3C, the common source line 312 is located in the substrate at the bottom of one of the trenches 304.

In addition, the flash memory in the present invention can further include a plurality of conductive lines (not shown) that connect electrically with various drain regions 310 through a plurality of contacts 320.

Figure 4A:
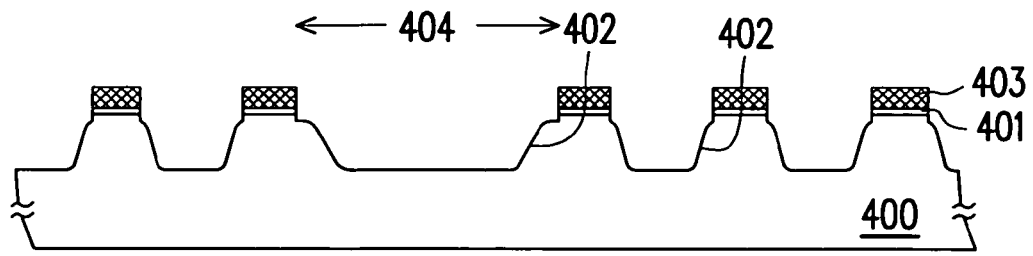
FIGS. 4A through 4G are schematic cross-sectional views showing the steps for fabricating a flash memory according to a second embodiment of the present invention.

FIGS. 4A through 4G are schematic cross-sectional views showing the steps for fabricating a flash memory according to a second embodiment of the present invention. As shown in FIG. 4A, a substrate 400 having a plurality of source region (see Label 306 in FIG. 3) and a plurality of drain region aligned in a first direction thereon (see Label 310 in FIG. 3) is provided. Then, a plurality of trenches 402 aligned in a second direction are formed on the surface of the substrate 400. The trenches 402 have at least one common source region 404. The conventional method is used to form the trenches 402. For example, a patterned pad dielectric layer 401 and a hard mask layer 403 are formed over the substrate 400, and then the substrate 400 is etched to form the trenches 402 using the patterned pad dielectric layer and the hard mask layer 403 as an etching mask.

Figure 4B:
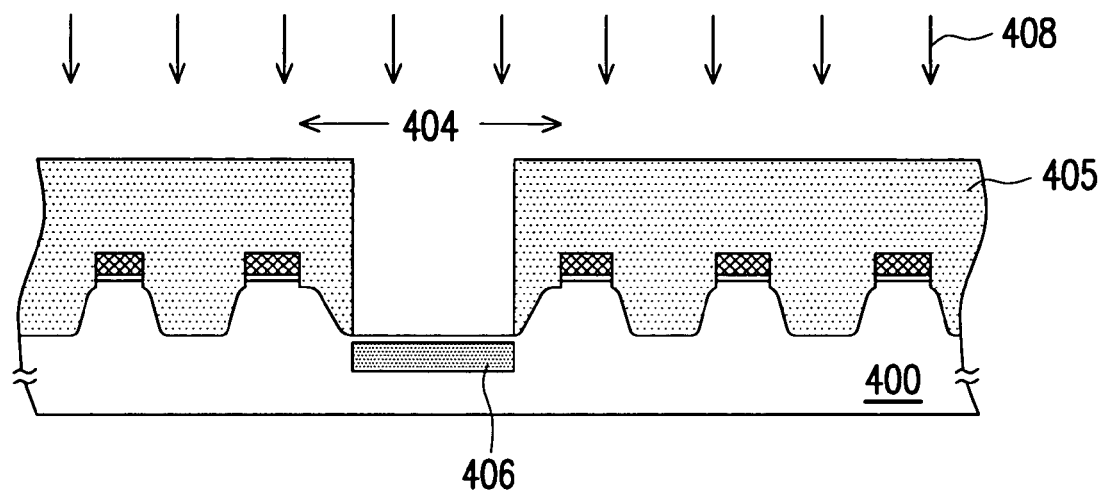

As shown in FIG. 4B, a first doped region 406 is formed in the substrate 400 at the bottom of the common source region 404. The step for forming the first doped region 406 includes forming a patterned mask layer 405 over the substrate 400 to expose the substrate 400 at the bottom of the common source region 404 and performing an ion implanting process 408 on the substrate 400 thereafter.

Figure 4C:
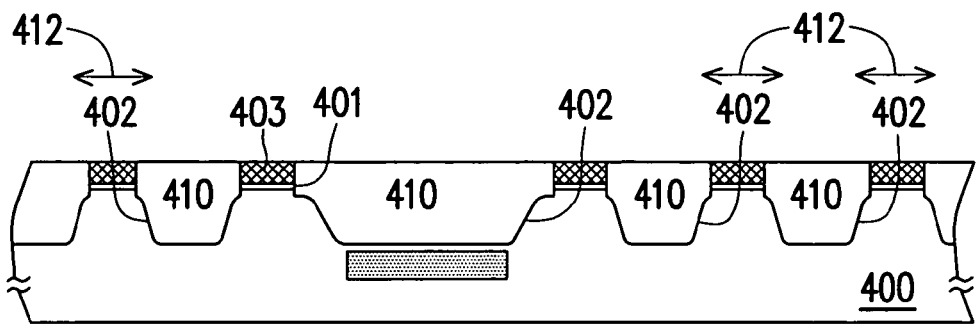

As shown in FIG. 4C, the patterned mask layer 405 is removed after the first doped region 406 is formed. Thereafter, insulating material is filled into the trenches 402 to form a plurality of isolation structures 410 and define a plurality of active regions 412. The method of forming the isolation structures 410 includes depositing insulating material to cover the entire substrate 400 and then performing a planarization process to remove a portion of the insulating layer until the hard mask layer 403 is exposed.

Figure 4D:
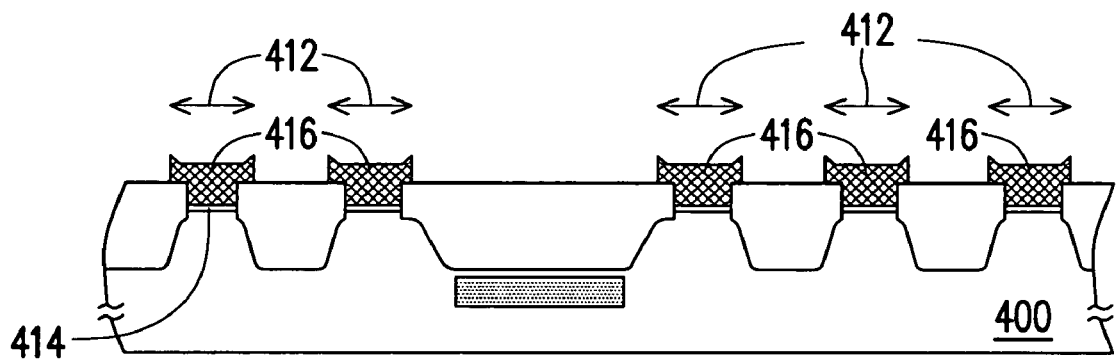

As shown in FIG. 4D, the pad dielectric layer 401 and the hard mask layer 403 are removed. Thereafter, a tunneling dielectric layer 414 and a floating gate 416 are sequentially formed on the substrate 400 between the source region and the drain region within the respective active regions 412.

Figure 4E:
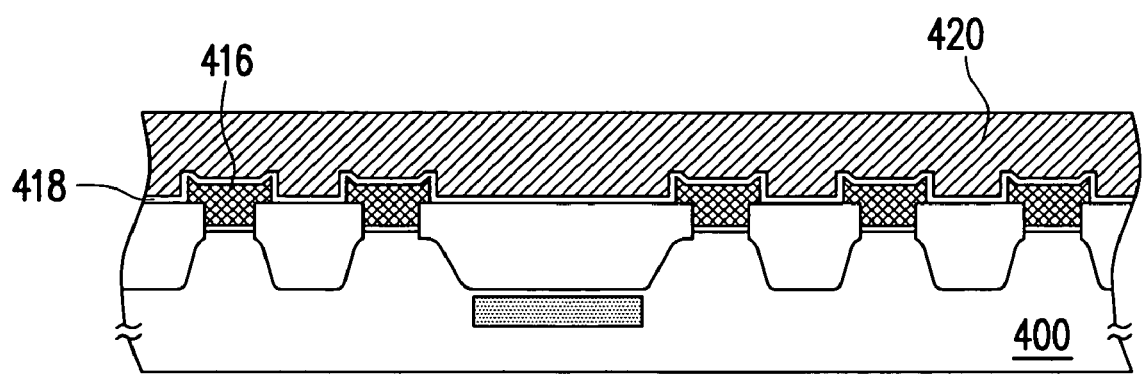

As shown in FIG. 4E, a dielectric layer 418 is formed over the substrate 400 to cover the floating gates 416. Thereafter, a plurality of control gate lines 420 are formed between the respective source regions and drain regions.

Figure 4F:
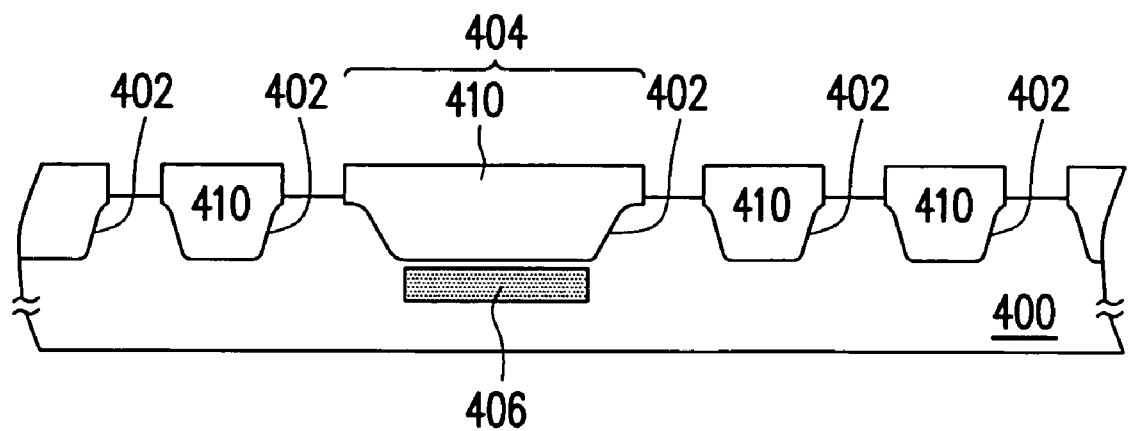

As shown in FIG. 4F, the isolation structures 410 within the trenches 402 of the substrate 400 isolate the respective source regions, and the common source region 404 has a first doped region 406.

Figure 4G:
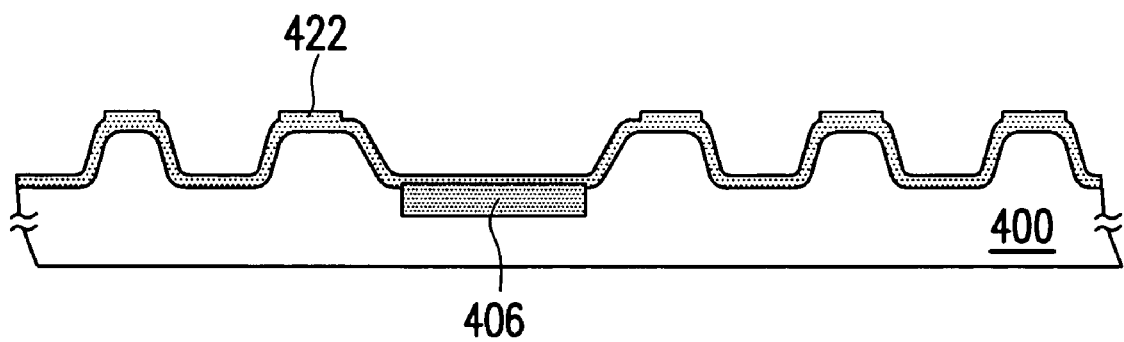

As shown in FIG. 4G, the isolation structures 410 in the source regions are removed. Thereafter, second doped regions 422 are formed within the exposed substrate 400. The second doped regions 422 within the source regions are electrically connected to the first doped region 406. After the second doped regions are formed, a plurality of conductive lines (not shown) for connecting with various drain regions are formed on the substrate 400.

Figure 5A:
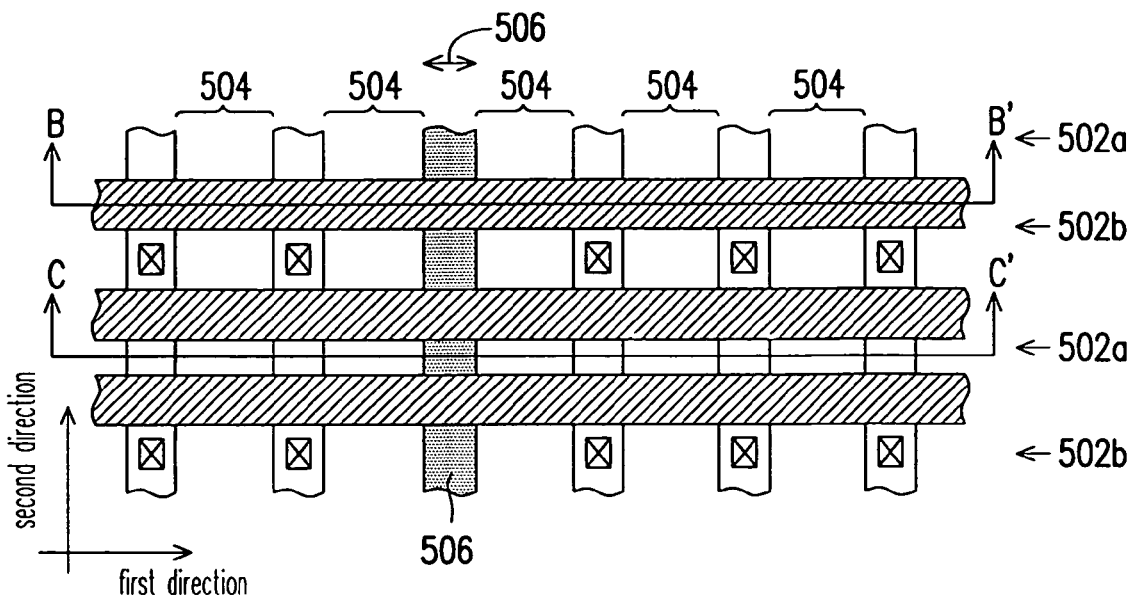
FIG. 5A is a top view of a flash memory according to a third embodiment of the present invention.
Figure 5B:
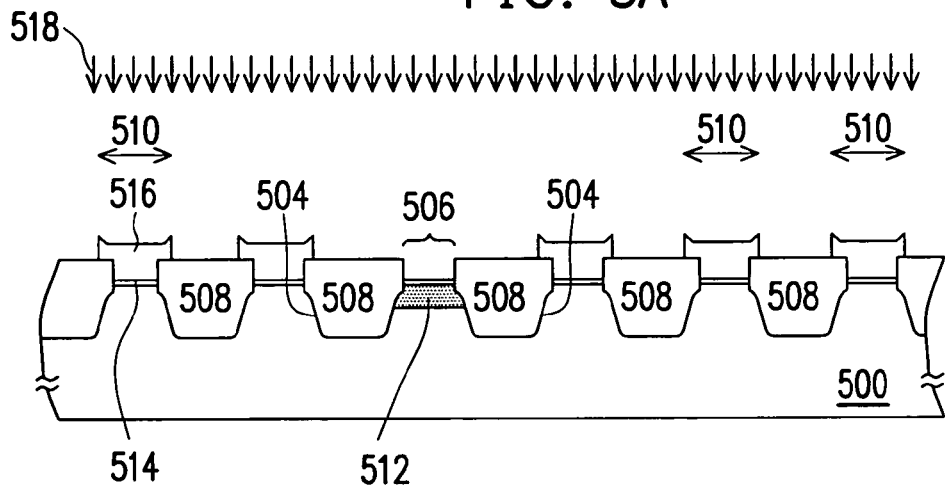
FIG. 5B is a schematic cross-sectional view along line B-B' of FIG. 5A.

FIG. 5A is a top view of a flash memory according to a third embodiment of the present invention. FIG. 5B is a schematic cross-sectional view along line B-B' of FIG. 5A. As shown in FIGS. 5A and 5B, one major structural difference between the present embodiment and the one in FIG. 3 is that the common source line 512 is located in the substrate 500 between two adjacent trenches 504.

To form the common source line 512 as shown in FIG. 5A, a substrate 500 having a plurality of source regions 502a and a plurality of drain regions 502b aligned in a first direction thereon is provided. Then, a plurality of trenches 504 aligned in a second direction are formed on the surface of the substrate 500 such that there is a common source region 506 between two adjacent trenches 504.

Thereafter, insulating material is deposited into the trenches 504 to form a plurality of isolation structures 508 so as to define a plurality of active regions 510. After that, a tunneling dielectric layer 514 and a floating gate 516 are sequentially formed on the substrate 500 between the source region 502a and the drain region 502b within the respective active regions 510 while the substrate 500 of the common source region 506 is exposed. A first doped region 512 is formed on the exposed substrate 500 within the common source region 506. The method of forming the first doped region 512 includes performing an ion implanting process 518 on the substrate 500 using the floating gate 516 as a mask.

Thereafter, as shown in FIG. 4E in the second embodiment, a dielectric layer 418 is formed over the substrate to cover the floating gates, and then a plurality of control gate lines 420 are formed between the respective source regions and drain regions.

Figure 5C:
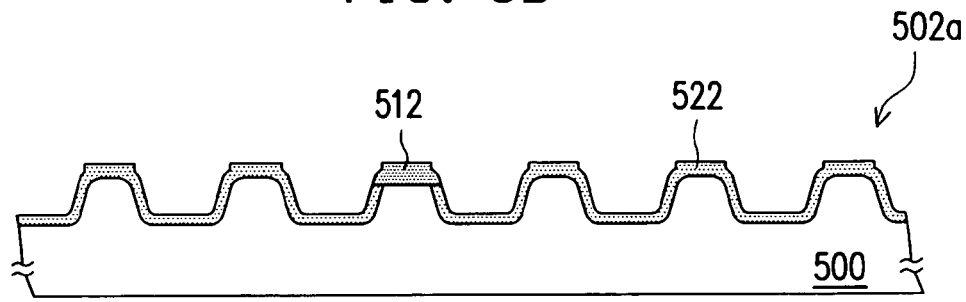
FIG. 5C is a schematic cross-sectional view along line C-C' of FIG. 5A.

FIG. 5C is a schematic cross-sectional view along line C-C' of FIG. 5A. After the control gates are formed, the isolation structures 508 in the source regions 502a are removed. Thereafter, a plurality of second doped regions 522 are formed on the exposed substrate 500. The second doped regions 522 within the source regions 502a are electrically connected to the first doped region 512. Furthermore, a plurality of conductive lines (not shown) can also be formed on the substrate to electrically connect with various drain regions.

In the present embodiment, the existing floating gates 516 are used as a mask to form the first doped region 512 in the process of fabricating the flash memory. In this way, the process for fabricating the memory is simplified and the area occupied by the memory is reduced.

Figure 6A:
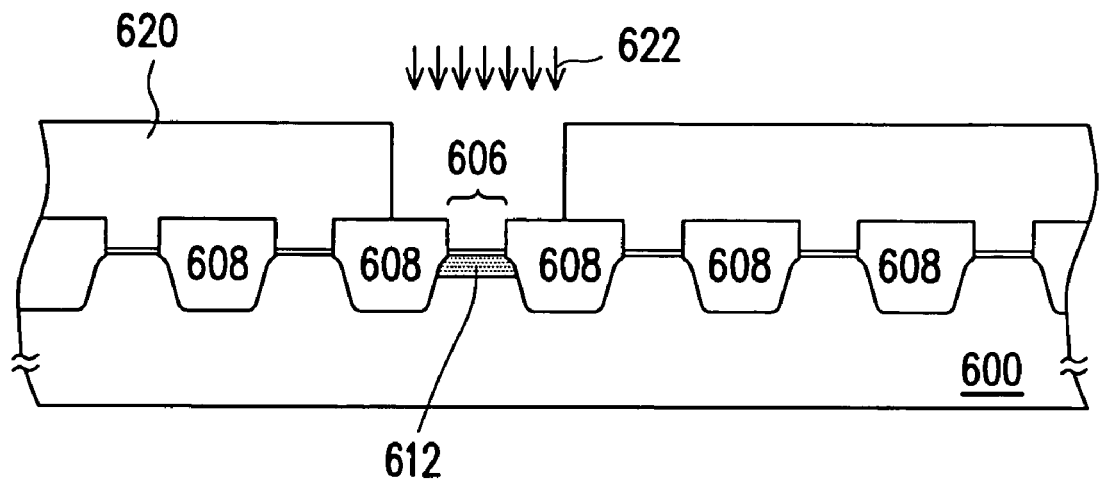
FIGS. 6A and 6B are schematic cross-sectional views showing the steps for fabricating a flash memory according to a fourth embodiment of the present invention.
Figure 6B:
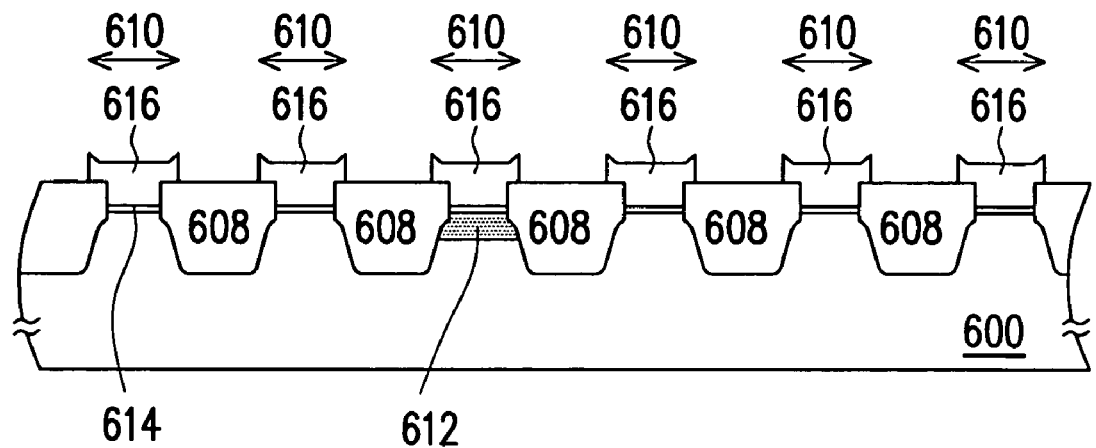

FIGS. 6A through 6B are schematic cross-sectional views showing the steps for fabricating a flash memory according to a fourth embodiment of the present invention. As shown in FIGS. 6A and 6B, this embodiment is similar to the third embodiment. One major difference is that a first doped region 612 is formed in the substrate 600 within the common source region 606 immediately after the isolation structures 608 that define the active regions 610 are formed. The method of forming the first doped region 612 includes depositing material to form a patterned mask layer 620 on the substrate 600 and expose the substrate 600 at the bottom of the common source region 606, then performing an ion implanting process 622 on the substrate 600.

As shown in FIG. 6B, the patterned mask layer 620 is removed. Thereafter, a tunneling dielectric layer 614 and a floating gate 616 are sequentially formed on the substrate 600 between the source region and the drain region within the respective active regions 610. Because there is a floating gate 616 (that is, a conductive layer) over the first doped region 612 (that is, the common source line), the fabrication process can be done with higher uniformity. In other words, the fabrication process has a higher precision than the previous several embodiments.

In summary, because of the common source line in the flash memory and fabricating method thereof in the present invention, there is no need to set up additional contacts to link with the source regions. Thus, the total surface area occupied by the memory can be reduced. Furthermore, the improvement in the present invention not only simplifies manufacturing process, but also increases processing precision.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flash memory, comprising:
   a substrate;
   a plurality of control gates aligned in a first direction on the substrate;
   a plurality of trenches aligned in a second direction on the surface of the substrate, wherein a row of memory cells are defined under a control gate and between the trenches;
   a plurality of common source regions aligned in the first direction, each disposed in the substrate and the trenches between a pair of neighboring control gates and shared by two rows of memory cells defined by the pair of neighboring control gates;
   a plurality of isolation structures filling the respective trenches between the common source regions;
   a plurality of rows of drain regions, wherein each row of drain regions are aligned in the first direction and disposed in the substrate between the isolation structures at a side of a pair of neighboring control gates with a common source region between them;
   one common source line aligned in the second direction, disposed in the substrate at a bottom of one of the trenches, and electrically connected to the common source regions, wherein the one trench at which the one common source line is disposed is wider than the other trenches;
   a plurality of floating gates disposed between the control gates and the substrate between the respective common source regions and drain regions;
   a plurality of tunneling dielectric layers disposed between the floating gates and the substrate; and
   a dielectric layer disposed between the floating gates and the control gates.

2. The flash memory of claim 1, wherein the memory further comprises a plurality of conductive lines to electrically connect with various drain regions.

* * * * *